(12) United States Patent
Kraft et al.

(10) Patent No.: US 8,623,762 B2
(45) Date of Patent: Jan. 7, 2014

(54) SEMICONDUCTOR DEVICE AND A METHOD FOR MAKING THE SEMICONDUCTOR DEVICE

(75) Inventors: Jochen Kraft, Oberaich (AT); Franz Schrank, Graz (AT)

(73) Assignee: AMS AG, Unterpremstaetten (AT)

( * ) Notice: Subject to any disclaimer, the term of this patent is extended or adjusted under 35 U.S.C. 154(b) by 527 days.

(21) Appl. No.: 12/621,322

(22) Filed: Nov. 18, 2009

(65) Prior Publication Data

US 2010/0123254 A1 May 20, 2010

(30) Foreign Application Priority Data

Nov. 19, 2008 (DE) .......................... 10 2008 058 001

(51) Int. Cl.
*H01L 21/44* (2006.01)

(52) U.S. Cl.
USPC ............. 438/667; 257/E21.597; 257/E23.011

(58) Field of Classification Search
USPC .................... 438/667; 257/E21.597, E23.011
See application file for complete search history.

(56) References Cited

U.S. PATENT DOCUMENTS

| | | | |
|---|---|---|---|
| 5,128,279 A * | 7/1992 | Nariani et al. ................ 438/623 |
| 6,110,825 A | 8/2000 | Mastromatteo et al. | |
| 6,323,546 B2 | 11/2001 | Hsuan et al. | |
| 6,352,923 B1 | 3/2002 | Hsuan et al. | |
| 6,867,446 B2 * | 3/2005 | Otani et al. .................... 257/295 |
| 7,399,683 B2 | 7/2008 | Noma et al. | |
| 7,402,515 B2 | 7/2008 | Arana et al. | |
| 7,429,529 B2 | 9/2008 | Farnworth et al. | |
| 7,704,874 B1 * | 4/2010 | Kar-Roy et al. ............. 438/672 |
| 8,432,032 B2 * | 4/2013 | Lin et al. ............... 257/E23.011 |
| 2004/0087126 A1 * | 5/2004 | Fartash ......................... 438/667 |
| 2005/0042808 A1 * | 2/2005 | Kawahigashi ................ 438/152 |
| 2007/0052080 A1 * | 3/2007 | Chen ............................. 438/598 |
| 2009/0014843 A1 * | 1/2009 | Kawashita et al. ........... 438/667 |

FOREIGN PATENT DOCUMENTS

| | | |
|---|---|---|
| EP | 0 926 723 | 11/1997 |
| WO | WO 2007/019199 | 2/2007 |

OTHER PUBLICATIONS

J. Vardaman, "3-D Through-Silicon Vias Become a Reality", Semiconductor International, Jun. 1, 2007.

* cited by examiner

*Primary Examiner* — Stephen W Smoot
*Assistant Examiner* — Sun M Kim
(74) *Attorney, Agent, or Firm* — McDermott Will & Emery LLP

(57) ABSTRACT

An opening (9) is made in the substrate (1) over a terminal pad (7). A dielectric layer (10), a metallization (11), a compensation layer (13) and a passivation layer (15) are deposited so that the passivation layer is separated from the metallization by the compensation layer at least within the opening. A material that is suitable for reducing a mechanical stress between the metallization and the passivation layer is chosen for the compensation layer.

6 Claims, 6 Drawing Sheets

SEMICONDUCTOR DEVICE AND A METHOD FOR MAKING THE SEMICONDUCTOR DEVICE

RELATED APPLICATIONS

This application claims the priority of German application no. 10 2008 058 001.5 filed Nov. 19, 2008, the entire content of which is hereby incorporated by reference.

FIELD OF THE INVENTION

The present invention concerns the production of vias through semiconductor substrates. Electrically conductive connections between the upper side and lower side of the semiconductor substrate are used in the vertical integration of semiconductor devices.

BACKGROUND OF THE INVENTION

To connect more than one semiconductor device, a number of semiconductor chips are stacked vertically one on the other and connected together through electrical terminal contacts on the upper sides and lower sides. For this, electrically conductive connections must be made from the relevant upper side of the chip to the lower side through the substrate. This usually is done by etching holes in the substrate and then filling them with an electrically conductive material, usually a metal. If the electrical conductors made in this way do not reach the backside of the substrate, the substrate is thinned from the backside by grinding until the conductive material of the contact hole filling is exposed and in this way the via is produced. Metal layers can be applied to the surfaces of the substrate and structured into electric terminals. When the chips are stacked, the matching terminal contact areas are arranged on top of each other and, electrically connected together permanently, for example by soldering (J. Vardaman, "3-D Through-Silicon Vias Become a Reality", Semiconductor International, Jun. 1, 2007).

Vias with diameters of typically about 50 μm to 100 μm can be made by etching larger recesses with slanted side walls, for example, using KOH. A metal layer deposited in the recess is exposed from the opposite surface of the wafer and provided with a contact there. Current conventional methods are described in U.S. Pat. No. 6,323,546, U.S. Pat. No. 6,352,923 and U.S. Pat. No. 6,110,825.

The metal layer of the via is covered with a passivation layer. It was established that cracks can occur in the passivation layer, or the passivation layer can separate from the metal layer.

U.S. Pat. No. 7,402,515 describes a via in which the contact hole is filled with a metal and a buffer layer is present to compensate for mechanical stresses between the semiconductor material and the metal. Materials mentioned for the buffer layer are silicones, acrylates, especially PMMA (polymethyl methacrylate), polyimide, benzocyclobutene (BCB), epoxy resin, polyparaxylene, fluorocarbons, especially PTFE (polytetrafluoroethylene), organic silicon compounds like PDMS (polydimethylsiloxane), polyesters and polyolefins.

SUMMARY OF THE INVENTION

It is an object of the present invention to prevent damage to a passivation layer deposited on the metal in the contact hole of a via formed through a semiconductor substrate.

In one embodiment of a production process according to the invention, first a substrate of a semiconductor material with a buried terminal pad of electrically conductive material is made ready. Coming from an upper side of the substrate, the semiconductor material over the terminal pad is removed and in this way an opening in the substrate is made. A dielectric layer is deposited, so that the subsequently deposited metal is isolated from the semiconductor material. Within the opening, an upper side of the terminal pad is exposed. A metallization that contacts the terminal pad and is separated from the substrate by the dielectric layer is deposited. The metallization is intended as the electric conductor of the via. A compensation layer that completely covers the metallization within the opening is deposited. A material that is suitable for reducing chemical stress between the metallization and the subsequently deposited passivation layer is chosen for the compensation layer. The compensation layer is preferably structured so that it is present within the opening and on a narrow region of the upper side at the edge of the opening. A passivation layer is deposited so that the passivation layer is separated from the metallization by the compensation layer at least within the opening.

The semiconductor device accordingly has a substrate of semiconductor material that is provided with an opening that forms a bottom and a side wall. At the bottom of the opening there is an electrically conductive terminal pad. At the bottom and at the side wall of the opening there is a metallization, which is electrically connected to the terminal pad and separated from the semiconductor material by a dielectric layer. On the metallization there is a compensation layer, which completely covers the metallization within the opening. On the compensation layer there is a passivation layer, which is separated from the metallization by the compensation layer within the opening.

The compensation layer can be a polymer, especially a polyimide. The passivation layer can be an oxide and/or a nitride of the semiconductor material. To complete the via to the backside of the substrate, a backside via can be arranged on the side of the terminal pad facing away from the opening.

BRIEF DESCRIPTION OF THE DRAWINGS

Below is a more detailed description of embodiments of the semiconductor device and the production method, in conjunction with the accompanying figures.

DETAILED DESCRIPTION OF THE DRAWINGS

Figure 1:
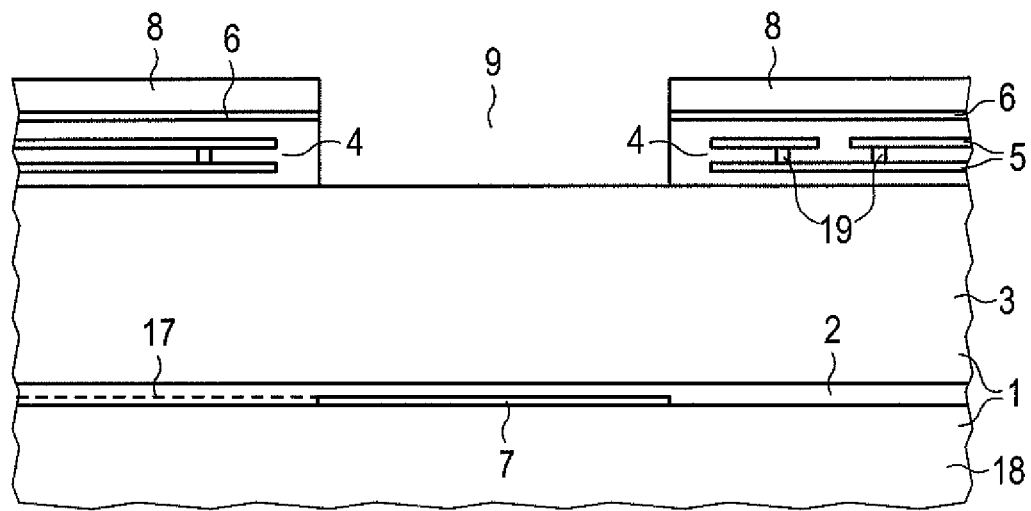
FIG. 1 shows a cross section through a first intermediate product of an embodiment of the method.

An intermediate product of an example of the production process is shown in cross section in FIG. 1. The substrate 1 of semiconductor material in this example has an isolation layer 2, which divides substrate 1 into an upper semiconductor layer 3 and a portion 18 usually called bulk. Within the isolation layer 2 there is arranged a terminal pad 7 of an electrically conductive material, preferably a metal. Terminal pad 7 can be provided with an electric lead 17 arranged within the isolation layer 2 (indicated with a broken line in FIG. 1 as a further embodiment). Lead 17 can be provided as the electric connection of the terminal pad with components integrated in the substrate. Terminal pad 7 enables a particularly easy production of the via.

The arrangement that is shown can be made by the process of wafer bonding, for example, known per se. In this process two semiconductor substrates or wafers are used, with one being for semiconductor layer 3 and the other for bulk 18. A surface of one of the substrates is provided with the isolation layer 2, which is then permanently affixed to a surface of the other substrate. This results in the layer sequence shown in cross section in FIG. 1, in which the isolation layer 2 is embedded at its upper and lower boundary surfaces in the semiconductor material. In this production method the terminal pad 7 is produced on one of the two surfaces to be assembled and structured so that, after the wafer bonding, terminal pad 7 is buried as shown in FIG. 1.

Wiring that usually comprises one or more metal planes 5 and an intermetal dielectric 4 can be present on the upper side of substrate 1 above semiconductor layer 3. For electric connection between the conducting paths of different metal planes, wiring vias 19 are provided through the intermetal dielectric. This is shown in FIG. 1 in a schematic example, which can be modified as desired. In the embodiment that is shown, the upper side of the wiring is covered with a liner 6, which can be made of Ti/TiN, for example, and can optionally also be used as an etch stop layer.

A mask 8 is deposited and structured on the upper side of the device. This mask is, for example, a photo resist mask, which is preferably made relatively thick. Using mask 8, an opening 9 is etched in the liner 6 and the intermetal dielectric 4.

Figure 2:
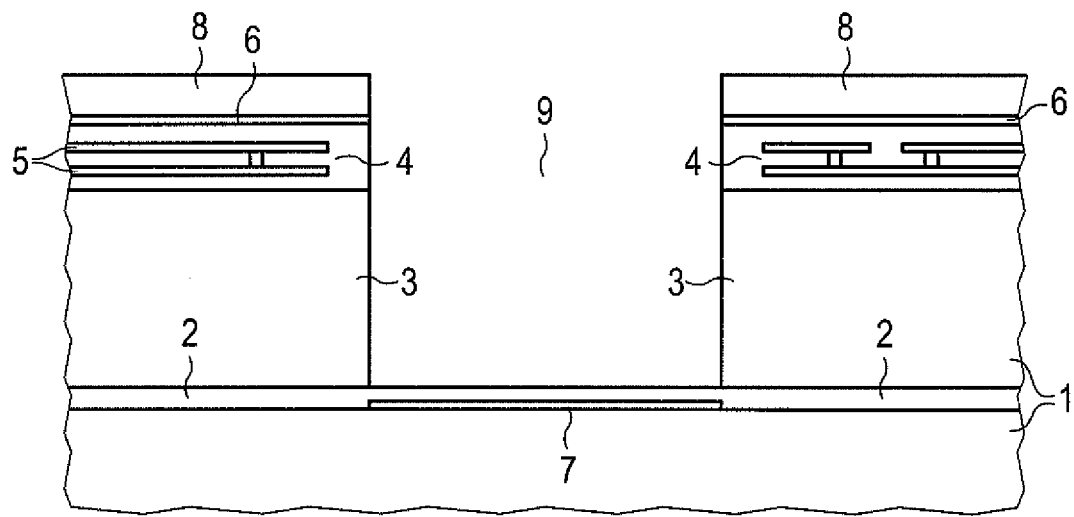
FIG. 2 shows a cross section as in FIG. 1 after etching an opening for the via.

FIG. 2 shows a cross section through another intermediate product after etching the semiconductor material down to the isolation layer 2. This etching step can be effected by RIE (reactive ion etching), preferably by DRIE (deep reactive ion etching). The isolation layer 2 in this case functions as an etch stop layer. In correspondence with the cross section in FIG. 2, opening 9 is made down to isolation layer 2. The etching can preferably be carried out perpendicular to the upper side of the substrate, thus highly anisotropic, in order to form side walls in the etched opening 9 that are as steep as possible, and to limit lateral extension of opening 9 in this way to the diameter necessary for the via.

Figure 3:
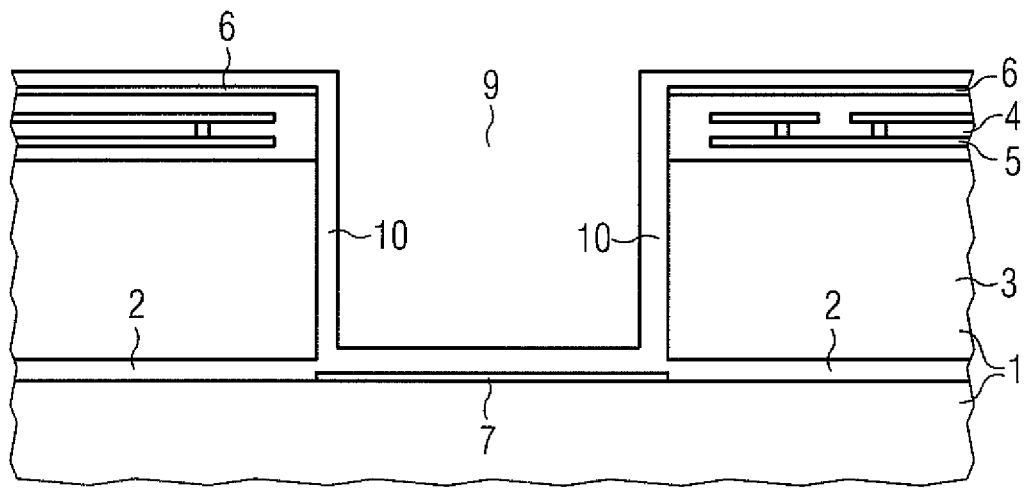
FIG. 3 shows a cross section as in FIG. 2 after deposition of a dielectric layer.

FIG. 3 shows a cross section in accordance with FIG. 2 for another intermediate product after deposition of a dielectric layer 10. There is no boundary indicated between isolation layer 2 and dielectric layer 10, in order to point out that both layers can be made of an oxide. The dielectric layer 10 is deposited over the entire surface and can in particular be silicon dioxide. The method of CVD (chemical vapor deposition), especially SACVD (subatmospheric chemical vapor deposition), is suitable for deposition of dielectric layer 10. This method is well known per se from the semiconductor industry.

Figure 4:
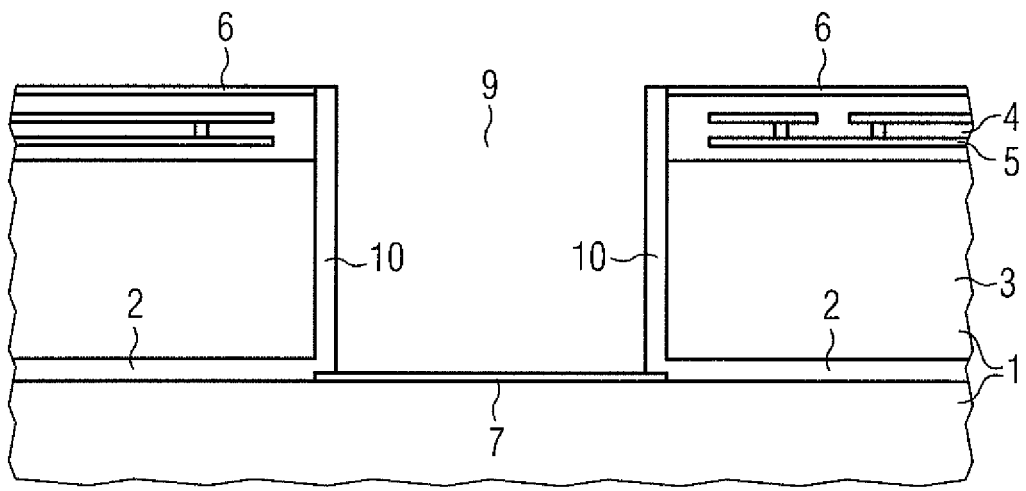
FIG. 4 shows a cross section as in FIG. 3 after partial back etching of the dielectric layer.

FIG. 4 shows another intermediate product in cross section, after removal of dielectric layer 10 down to residual portions on the side walls of opening 9. The terminal pad 7 is now exposed at the bottom of opening 9. The partial removal of dielectric layer 10 can take place, for example, by means of RIE, where liner 6 serves as an etch stop layer. This is especially advantageous if an oxide of the semiconductor material is also used as intermetal dielectric 4. The anisotropic etching allows dielectric layer 10 on the horizontal surfaces to be removed completely while dielectric 10 on the side walls within opening 9 remains sufficiently thick for isolation. Terminal pad 7 likewise serves as an etch stop layer.

Figure 5:
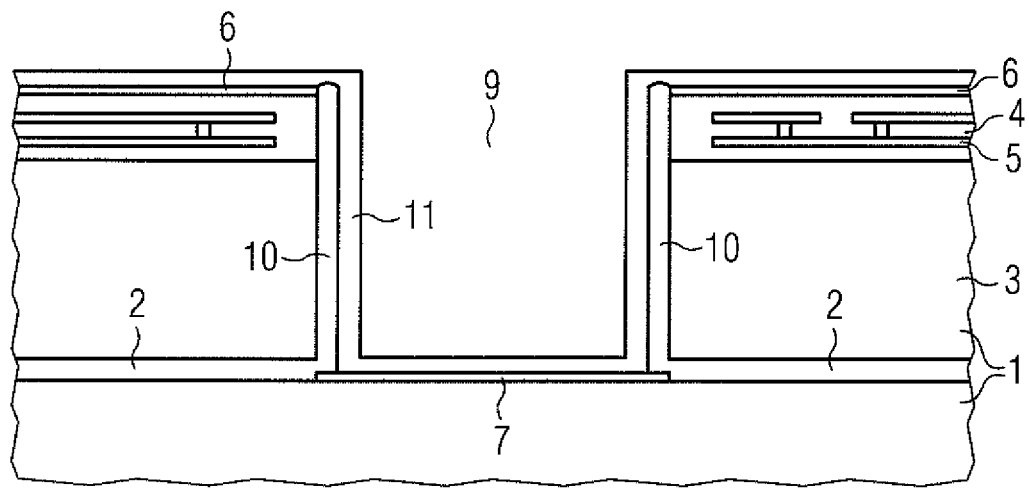
FIG. 5 shows a cross section as in FIG. 4 after deposition of a metallization.

FIG. 5 shows a cross section in accordance with FIG. 4 after deposition of a metallization 11. The metallization 11 can be produced, for example, by isotropic MOCVD (metal-organic chemical vapor deposition), and is tungsten, for example. The metallization 11, which is initially present over the entire surface, can then be etched back without using a mask. The process is carried out in such a way that the etching rate on the upper side is higher than at the bottom of opening 9 and at the side walls.

Figure 6:
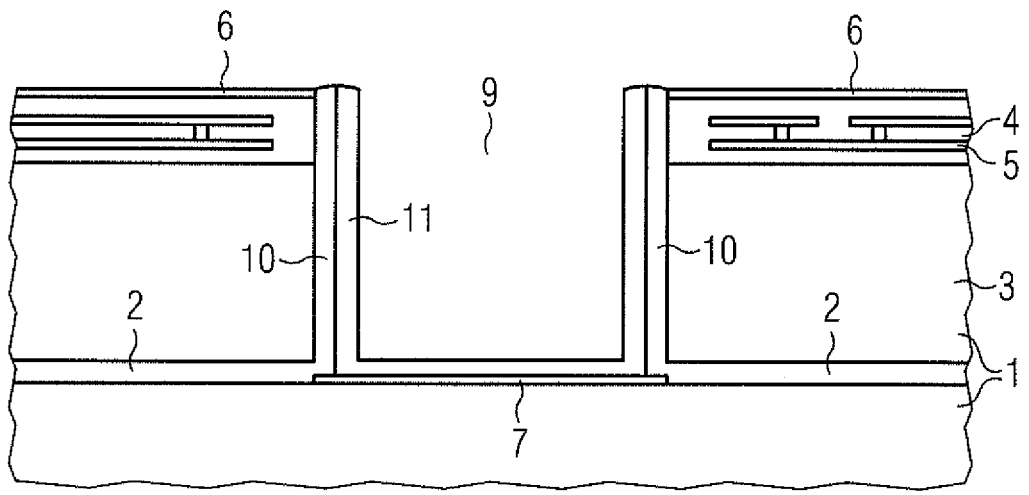
FIG. 6 shows a cross section as in FIG. 5 after partial back etching of the metallization.

FIG. 6 shows a cross section in accordance with FIG. 5, after the upper side removal of metallization 11, of which now only a portion is still present on the bottom and at the side walls within opening 9. Since the dielectric layer 10 was removed from the terminal pad 7, at the bottom of opening 9 there is now an electric contact between metallization 11 and the terminal pad. Metallization 11 can then be contacted at the upper side by deposition of an upper side terminal metallization, called top metal in what follows. Any metal that is usually used for conductive paths is suitable for it, in particular, aluminum, for example.

Figure 7:
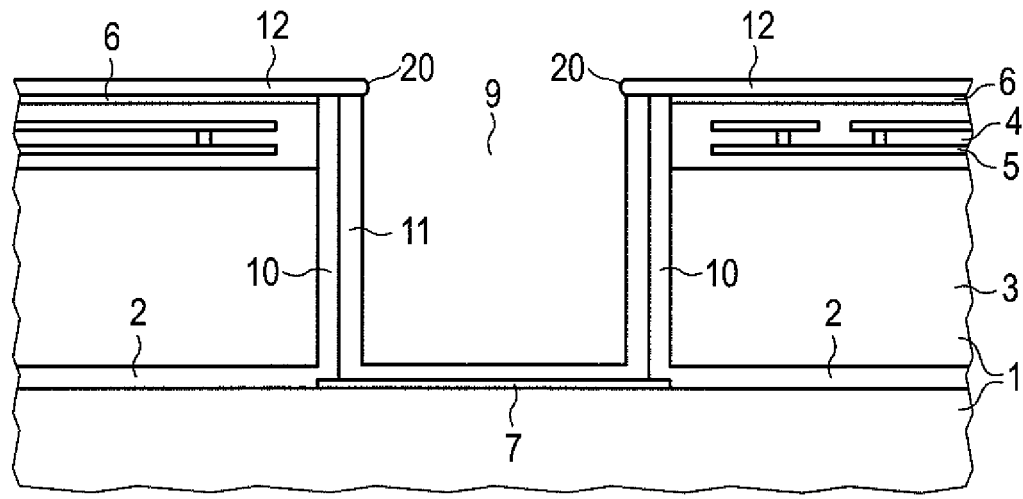
FIG. 7 shows a cross section as in FIG. 6 after deposition of a top metal.

FIG. 7 shows a cross section in accordance with FIG. 6, after deposition of a layer of a top metal 12, which forms a bead 20 at the upper edge formed by the rim of opening 9, where the bead can be made larger or smaller than shown in FIG. 7. This ensures that an electrically conductive connection is made between the remaining portion of metallization 11 and the top metal 12. The electric connection between metallization 11 and top metal 12 is consequently already formed in situ upon application of top metal 12. The top metal 12 can be structured in correspondence with the intended electric connections.

Figure 8:
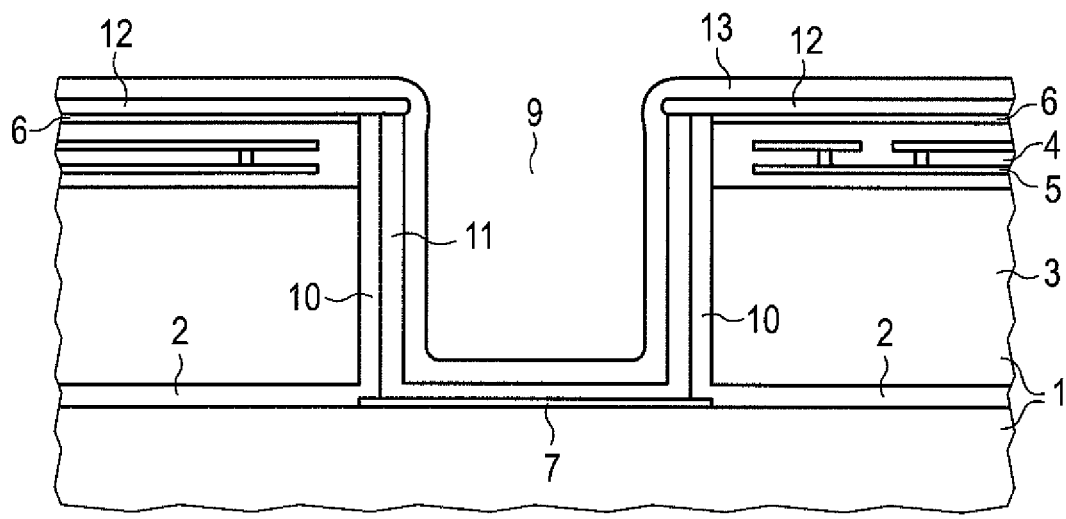
FIG. 8 shows a cross section as in FIG. 7 after deposition of a compensation layer.

FIG. 8 shows a cross section in accordance with FIG. 7, after deposition over the entire surface of a compensation layer 13, which does not fill opening 9. The compensation layer 13 is made of a material that is suitable for reducing mechanical stress between metallization 11 and a subsequently applied passivation layer. Suitable materials are in particular polymers, for example a polyimide, which can be deposited, for example, by the substantially known nano-spray process.

Figure 9:
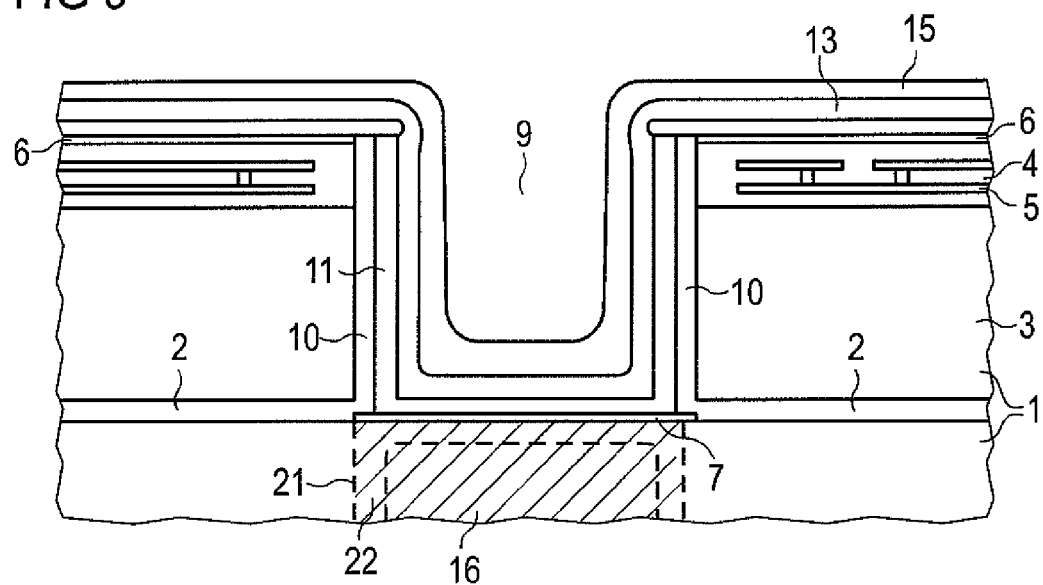
FIG. 9 shows a cross section as in FIG. 8 after deposition of a passivation layer.

FIG. 9 shows a cross section in accordance with FIG. 8 after deposition of a passivation layer 15. The passivation layer 15 can be a single layer or a multiple layer and can be formed, for example, with an oxide layer 15a, in particular a silicon oxide layer, and a nitride layer 15b deposited thereon, in particular a silicon nitride layer. Passivation layer 15 can be made, for example, by means of a standard PECVD process (plasma-enhanced chemical vapor deposition). An oxide layer of the passivation layer 15 can also be deposited by means of an SACVD process (subatmospheric chemical vapor deposition). Layers of a multilayer passivation layer 15 can also be deposited partly by PECVD and partly by SACVD.

Figure 10:
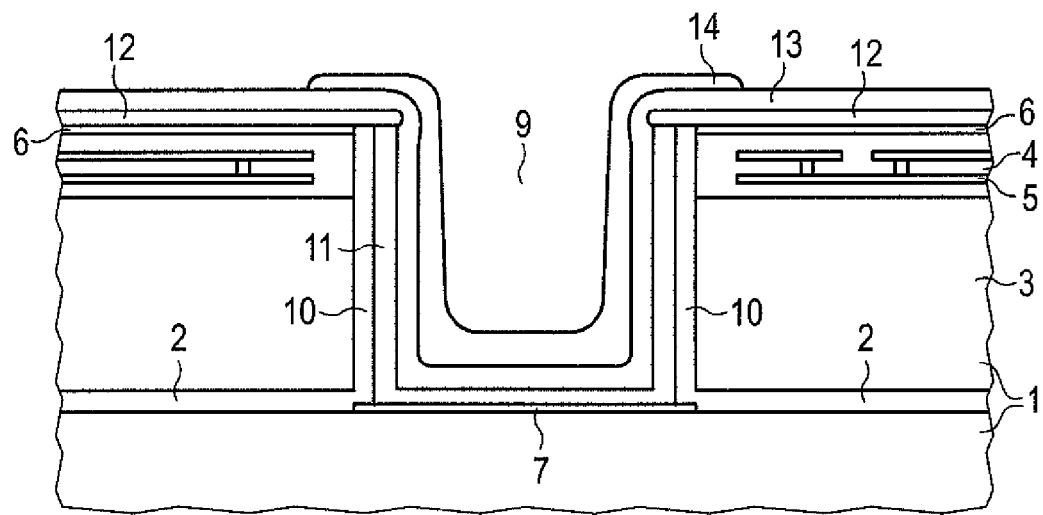
FIG. 10 shows a cross section as in FIG. 8 after making a mask.

FIG. 10 shows a cross section in accordance with FIG. 8 after deposition of the compensation layer 13 and preparation of a mask 14 on compensation layer 13. Mask 14 is preferably a photo resist, which is structured in the usual way by exposure to light, development, and selective removal with a solvent.

Figure 11:
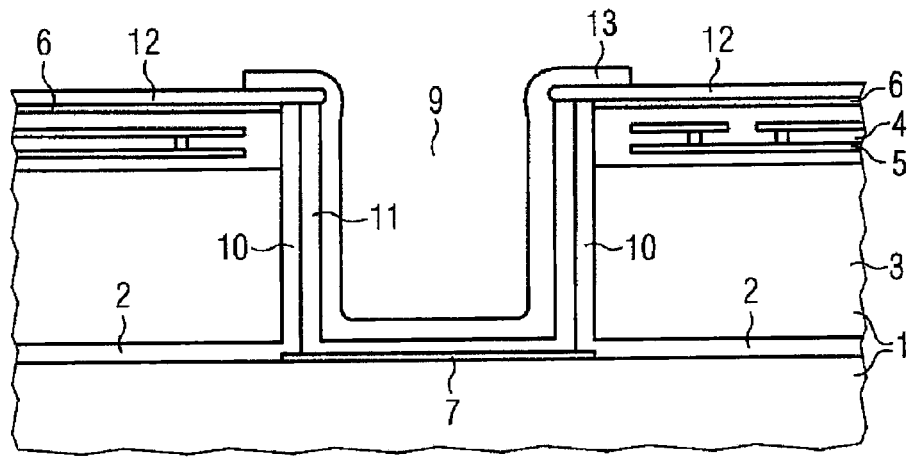
FIG. 11 shows a cross section as in FIG. 10 after structuring the compensation layer and removal of the mask.

FIG. 11 shows a cross section in accordance with FIG. 10 after structuring the compensation layer 13 using mask 14 and after removal of mask 14. Of the compensation layer 13 there is now left a residual portion that covers the bottom and side walls of opening 9, and a narrow region of the upper side along the rim of opening 9. In the embodiment that is shown, in which the metallization 11 was removed on the upper side and a top metal 12 was deposited, the remaining portion of the compensation layer covers the metallization 11 completely. If a photoactive material is used for compensation layer 13, for example, a polyimide, the compensation layer 13 can be structured even without using a special photo resist mask. This takes place, for example, by exposing the portions of the compensation layer 13 that are supposed to be removed to light and, after developing them, removing them by means of a solvent.

Figure 12:
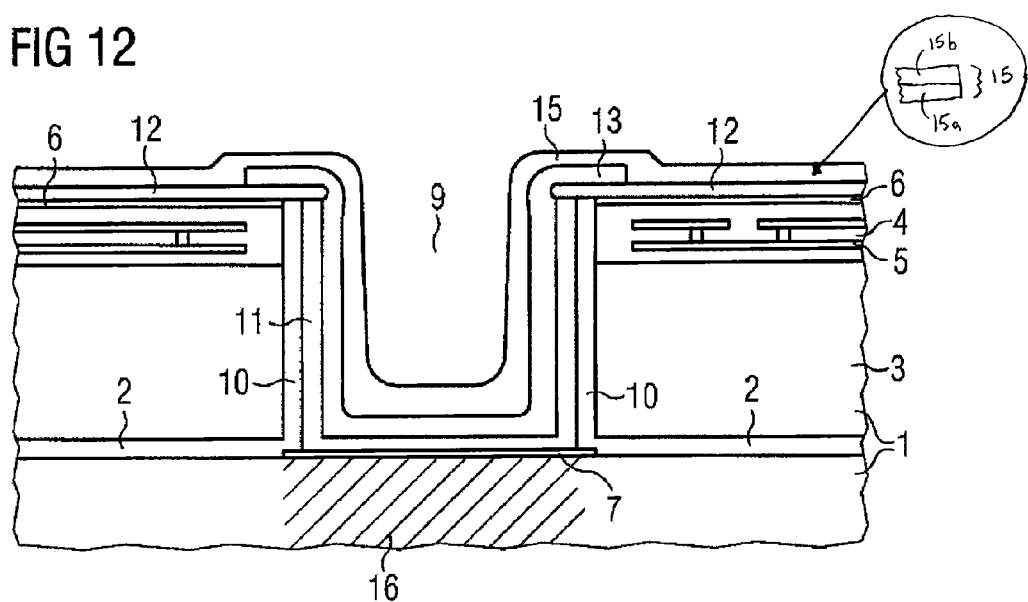
FIG. 12 shows a cross section as in FIG. 11 after deposition of a passivation layer.

FIG. 12 shows a cross section in accordance with FIG. 11 after deposition of passivation layer 15 onto the structured compensation layer 13 and the free surface of top metal 12. With that one obtains an alternative arrangement by comparison with the embodiment of FIG. 9. Also, the passivation layer 15 can possibly be structured with a resist mask.

The via can be completed in an easy way by making a recess 21 in a backside region 16, which is shown in FIG. 9 by hatch lines, with which the backside of terminal pad 7 is exposed. An additional metallization 22 can be deposited there, which makes a complete electrically conductive connection between top metal 12 and the backside of substrate 1. The same arrangement can be used for the backside region 16 shown in FIG. 12.

We claim:

1. A method for producing a semiconductor device, comprising the steps of:
   providing a substrate of a semiconductor material with a buried terminal pad of electrically conductive material;
   removing, from an upper side of the substrate, the semiconductor material over the terminal pad to make an opening;
   depositing a dielectric layer;
   within the opening, exposing the terminal pad;
   depositing a metallization, which contacts the terminal pad and is separated from the substrate by the dielectric layer;
   depositing a compensation layer, which completely covers the metallization within the opening, on a bottom of the opening, on side walls of the opening and on a region of an upper side of the device along the rim of the opening and outside of the opening; and
   depositing a passivation layer, which is separated from the metallization by the compensation layer within the opening, into the opening and on the upper side of the device outside of the opening,
   wherein the compensation layer is a polymer.

2. The method of claim 1, in which the compensation layer is a polyimide.

3. The method of claim 1, further comprising:
   removing the metallization outside of the opening before deposition of the compensation layer,
   depositing a top metal, which contacts the upper rim of the metallization, and
   forming the compensation layer so that the metallization is completely covered.

4. The method according to claim 1, further comprising:
   removing the semiconductor material in a backside region of the substrate that is opposite to the opening, and
   forming a backside via extending to the terminal pad.

5. The method according to claim 1, wherein the passivation layer is made of at least two layers of different materials.

6. The method of claim 5, wherein the passivation layer is made by first depositing an oxide layer and then depositing a nitride layer on the oxide layer.

* * * * *